United States Patent

Miyanaga et al.

[11] Patent Number: 5,418,187
[45] Date of Patent: May 23, 1995

[54] METHOD FOR EXTENDING ELECTRICALLY CONDUCTIVE LAYER INTO ELECTRICALLY INSULATING LAYER

[75] Inventors: Isao Miyanaga, Moriguchi; Yasushi Okuda, Takatsuki, both of Japan

[73] Assignee: Matsushita Electric Industrial Co., Ltd., Osaka, Japan

[21] Appl. No.: 202,880

[22] Filed: Feb. 28, 1994

Related U.S. Application Data

[63] Continuation of Ser. No. 861,377, Mar. 31, 1992, abandoned.

[30] Foreign Application Priority Data

| Apr. 5, 1991 | [JP] | Japan | 3-072889 |
| Apr. 11, 1991 | [JP] | Japan | 3-078884 |
| Oct. 9, 1991 | [JP] | Japan | 3-261800 |
| Jan. 21, 1992 | [JP] | Japan | 4-008320 |

[51] Int. Cl.⁶ .................................... H01L 21/441
[52] U.S. Cl. .................................... 437/194; 437/195; 437/247
[58] Field of Search .................. 437/194, 195, 247

[56] References Cited

U.S. PATENT DOCUMENTS

4,728,627  3/1988  Mase et al.
5,082,801  1/1992  Nagata ........................ 437/195 X

FOREIGN PATENT DOCUMENTS

3184329  8/1991  Japan.

OTHER PUBLICATIONS

C. S. Park, et al "Contact Filling by Post-Annealing after Al Deposition," Preliminary Papers colleciton No. 2 of Japanese Applied Physics Society Meeting 38th Mar. 1991.

*Primary Examiner*—John S. Maples
*Attorney, Agent, or Firm*—Stevens, Davis, Miller & Mosher

[57] ABSTRACT

A method of manufacturing semiconductor devices, which realizes miniaturization, a higher aspect ratio of a via hole, a higher yield and reliability, and a high degree of controllability, by completely filling the via hole by performing heat treatment on an electrically conductive thin film in a vacuum atmosphere. The method involves extending an electrically conductive layer into an electrically insulating layer arranged on the electrically conductive layer including the steps of forming an electrically conductive film on a side wall of a via hole extending in the electrically insulating layer from the electrically conductive layer toward the outside of the electrically insulating layer, and heating the electrically conductive film and the electrically conductive layer so that the electrically conductive film flows into the via hole and the electrically conductive layer projects into the via hole.

70 Claims, 12 Drawing Sheets

F I G. 15
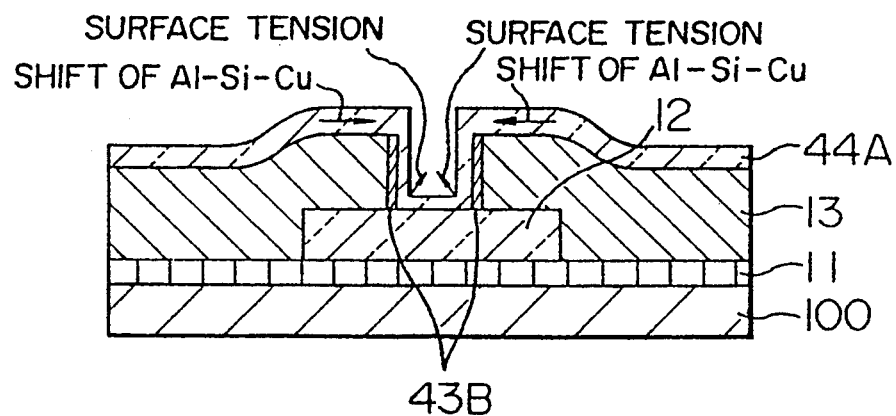
F I G. 16
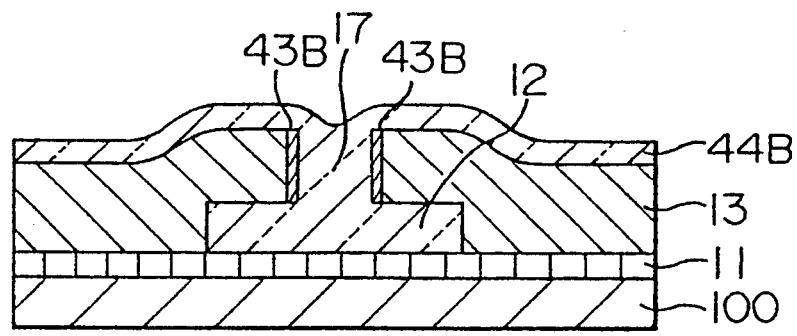
F I G. 17
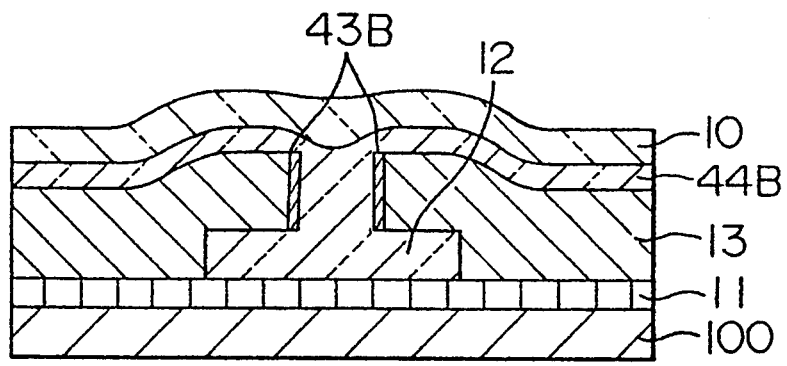

FIG. 22A   Ar $10 \times 10^{-3}$ Torr
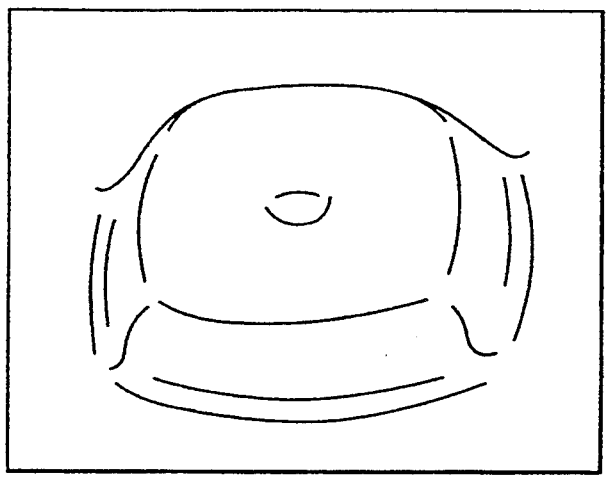
FIG. 22B   Ar $2 \times 10^{-3}$ Torr
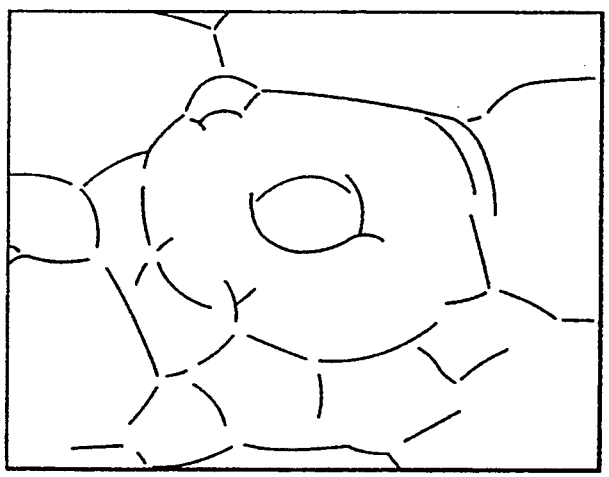
FIG. 22C   $\sim 10^{-7}$ Torr
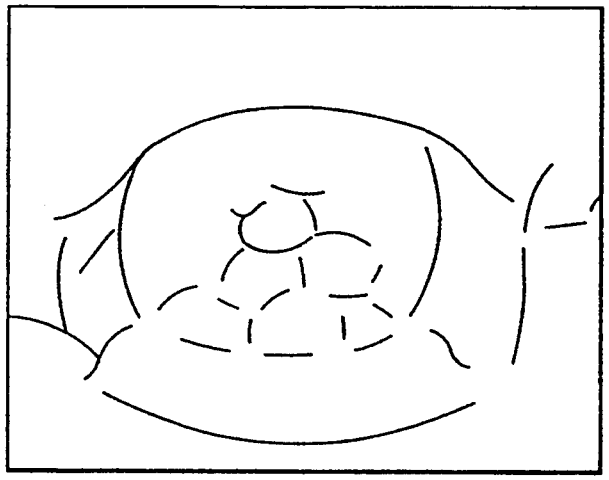

FIG. 23A  $10 \times 10^{-3}$ Torr
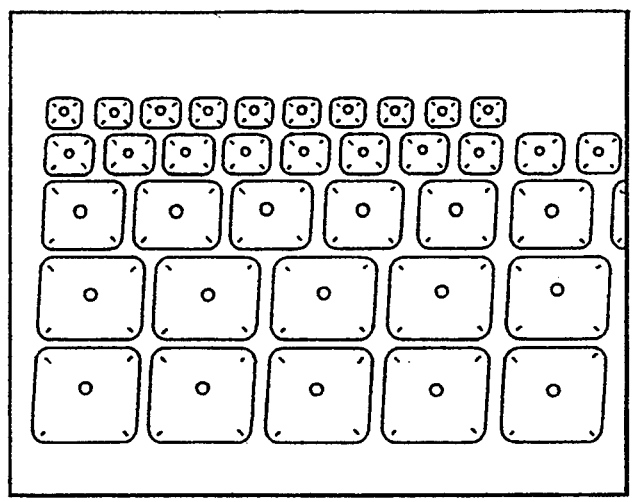
FIG. 23B  $2 \times 10^{-3}$ Torr
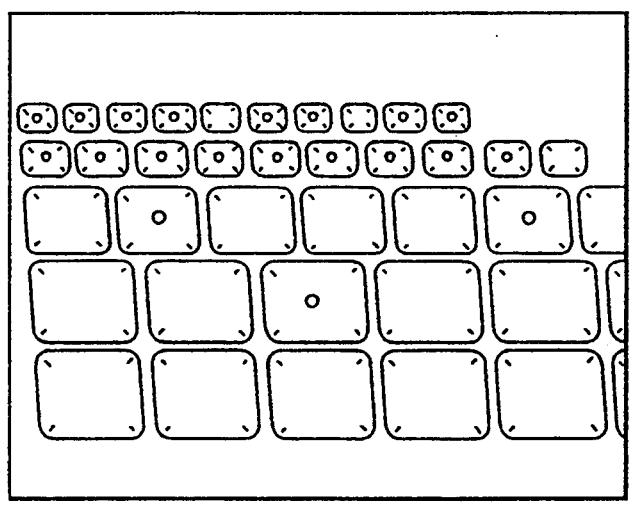
FIG. 23C  $\sim 10^{-7}$ Torr
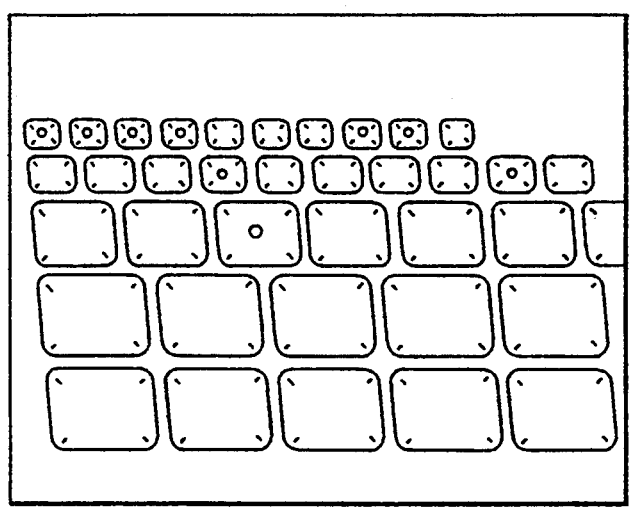

METHOD FOR EXTENDING ELECTRICALLY CONDUCTIVE LAYER INTO ELECTRICALLY INSULATING LAYER

This application is a continuation of application Ser. No. 07/861,377, filed Mar. 31, 1992.

BACKGROUND OF THE INVENTION

1. Field of the Invention

The present invention relates to a method for extending an electrically conductive layer into an electrically insulating layer arranged on the electrically conductive layer.

2. Description of the Related Art

In recent years, semiconductor integrated circuits are being made smaller. In response to the smaller size, there is a tendency for the opening dimension of a via hole formed for connecting the multilayers of wiring to be made smaller. As a result, the diameter of the opening of the connecting portion is smaller than the depth of the via hole. Thus, it has become difficult to make connections between multilayers of wiring. A lot of improvements have been made regarding such a problem in terms of reliability. One such improvement proposed is a manufacturing method of forming a hillock on an underlayer of wiring and connecting it with an upperlayer of wiring (U.S. Pat. No. 4,728,627).

An example of a method of manufacturing semiconductor devices employing the above-mentioned conventional multilayer wiring structure will be explained below with reference to the accompanying drawings.

FIG. 20 is a cross-sectional view which illustrates conventional steps of manufacturing semiconductor devices. In FIG. 20(a), an Al-Si film having a thickness of 1.0 μm is accumulated by sputtering on a semiconductor substrate 100 on which surface is formed a silicon oxide film; and the film is etched into a wiring pattern by a photolithographic process, forming a first layer of wiring 1. Thereafter, a p-SiN film 2 is accumulated to a thickness of 0.1 μm, as an insulating film having the function of suppressing hillocks, on the first layer of wiring 1 by a CVD method at 300° C. or lower. A p-SiN film 3 is accumulated 0.9 μm at a temperature of 380° C. as an interlayer insulating film. Next, a silica insulating film 4 having a thickness of 0.4 μm is formed for flattening the surfaces. In FIG. 20(b), a resin pattern 5 is formed by the photolithographic process. The silica insulating film 4, the p-SiN films 3 and 2 are in turn etched by using the resin pattern 5 as a mask, thus a through hole 6 is formed in a predetermined region on the first layer of wiring 1. In FIG. 20(c), the resin pattern 5 is removed, and a hillock 7 is formed from the first layer of wiring 1 in the through hole 6 by a heat treatment step for 15 minutes at 500° C. In FIG. 20(d), a second layer of wiring 8 is formed over the through hole and is connected to the first layer of wiring 1.

As a technique for forming contacts by means of which a semiconductor substrate is connected to a metallic wiring, a method has been proposed in which metallic wiring is accumulated into a contact hole and made to flow into the hole by performing heat treatment in a vacuum (the 38th Applied Physics Conference Preliminary Manuscript No. 2-31p-W-7).

An example of a method of manufacturing semiconductor devices employing the above-mentioned conventional contact forming technique will be explained below with reference to the accompanying drawings.

FIG. 21 shows cross-sectional views of conventional steps of manufacturing semiconductor devices. In FIG. 21(a), Al-Si-Cu 49A is accumulated to a thickness of 300 nm sputtering on a contact hole 48, formed on a semiconductor substrate 100, having a diameter of 0.8 μm and an aspect ratio of 1. Then, heat treatment is performed at a temperature of 550° C. in a vacuum, causing the Al-Si-Cu 49A to shift to the contact hole. In FIG. 21(b), the contact hole 48 is filled with the shifted Al-Si-Cu 49B.

OBJECT AND SUMMARY OF THE INVENTION

An object of the present invention is to provide a method for extending an electrically conductive layer into an electrically insulating layer arranged on the electrically conductive layer, in which method the electrically conductive layer can be extended into the electrically insulating layer securely without a discontinuity of the electrically conductive layer.

According to the present invention, a method for extending an electrically conductive layer into an electrically insulating layer arranged on the electrically conductive layer, comprises the steps of:

a forming step for forming an electrically conductive film on a side wall of a via hole extending in the electrically insulating layer from the electrically conductive layer toward the outside of the electrically insulating layer, and a heating step for heating the electrically conductive film and the electrically conductive layer so that the electrically conductive film flows in the via hole and the electrically conductive layer projects in the via hole.

According to the present invention, a method for extending an electrically conductive layer into an electrically insulating layer arranged on the electrically conductive layer, comprises the steps of:

a forming step for forming an intermediate film on a side wall of a via hole extending in the electrically insulating layer from the electrically conductive layer toward the outside of the electrically insulating layer, the intermediate film accelerating a shift of an electrically conductive substance on the side wall, and a heating step for heating the electrically conductive substance so that the electrically conductive substance flows on the side wall.

In the present invention, since the electrically conductive film or layer or substance moves on the side wall in the via hole, the electrically conductive layer can be extended into the electrically insulating layer The invention provides a method of manufacturing semiconductor devices, which realizes miniaturization and a higher aspect ratio of a via hole as well as a higher yield and reliability with a high degree of controllability by completely filling the via hole by performing heat treatment on an electrically conductive thin film in a vacuum atmosphere. An Al-1%Si-0.5% Cu film is accumulated to a thickness of 1.0 μm on a silicon substrate on which a BPSG film is accumulated, forming a first layer of metallic wiring. Thereafter, a silicon oxide film is accumulated on the entire surface of the semiconductor substrate, and flattened by etchback, forming an interlayer insulating film. The thickness of the first layer of metallic wiring is made to, for example, 0.8 μm. Next, an interlayer insulating film is selectively removed by a dry etching by using a resist as a mask, forming a via hole. The first layer of metallic wiring on the bottom of the via hole is sputtered and a natural oxide film on the first layer of metallic wiring is removed. Thereafter, an Al-Si-Cu thin film having a thickness of 0.2 μm is accumulated on the entire surface thereof. At this point, heat treatment is performed for 30 minutes at 500° C. in an atmosphere of argon (Ar) at a vacuum of approximately $10^{-7}$ Torr. The first layer of metallic wiring made of Al-Si-Cu is shifted to the bottom of the via hole, causing a hillock. At this time, the surface tension acts in such a manner as to push up the surface of the Al-Si-Cu thin film. As a result, the bottom of the via hole rises and further the Al-Si-Cu thin film, which has become likely to diffuse on the surface due to an increase in the temperature of the vacuum atmosphere, is shifted into the via hole. As a result, the through hole is completely filled with a portion which buries Al-Si-Cu. Finally, a wiring layer is formed on the Al-Si-Cu thin film.

The aforementioned and other objects, features and advantages of the present invention will become clearer when reference is made to the following description of the preferred embodiments of the present invention, together with reference to the accompanying drawings, wherein:

BRIEF DESCRIPTION OF THE DRAWINGS

FIG. 15 is a cross-sectional view which illustrates a fifth step according to the above embodiment of the present invention;

FIG. 16 is a cross-sectional view which illustrates a sixth step according to the above embodiment of the present invention;

FIG. 17 is a cross-sectional view which illustrates a seventh step according to the above embodiment of the present invention;

FIGS. 22A to 22C are schematic views of a SEM photograph which illustrate the surface shape of a through hole according to the fourth embodiment of the present invention; and FIGS. 23A to 23C are schematic views of a SEM photograph which illustrates the yield of burrying through holes according to the fourth embodiment of the present invention.

DESCRIPTION OF THE PREFERRED EMBODIMENTS

A method of manufacturing semiconductor devices according to the embodiments of the present invention will be explained below with reference to the accompanying drawings.

First Embodiment

FIGS. 1 (a) to 1 (e) are cross-sectional views which illustrate a method of manufacturing semiconductor devices according to the first embodiment of the present invention.

Figure 1A:
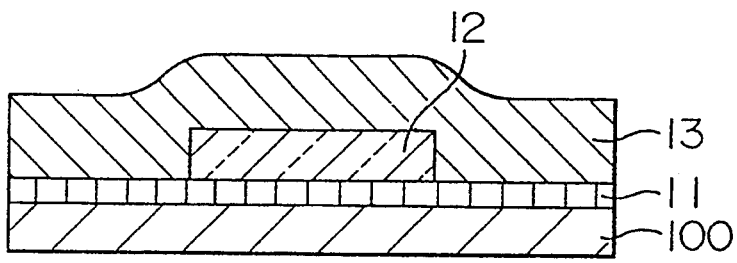
FIGS. 1(a)–(c) are cross-sectional view which illustrate a step according to a first embodiment of the present invention.

An Al-1%Si-0.5%Cu film is accumulated to a predetermined thickness, for example, 1.0 μm, through sputtering process on a silicon substrate on which, for example, a BPSG film 11 was accumulated previously by a thickness of 0.4 μm, through atmospheric pressure CVD process. Then, a first layer of metallic wiring 12 as a thermally plastic layer with wiring shaped pattern is formed by using a photolithographic process. Thereafter, a silicon oxide film is accumulated on the entire surface of a semiconductor device by the CVD method at 390° C. and is flattened by etchback, forming an interlayer insulating film 13, which is shown in FIG. 1(a). To secure isolation voltage at this time, the film thickness on a first layer of metallic wiring 12 is made to, for example, 0.8 μm.

Figure 1B:
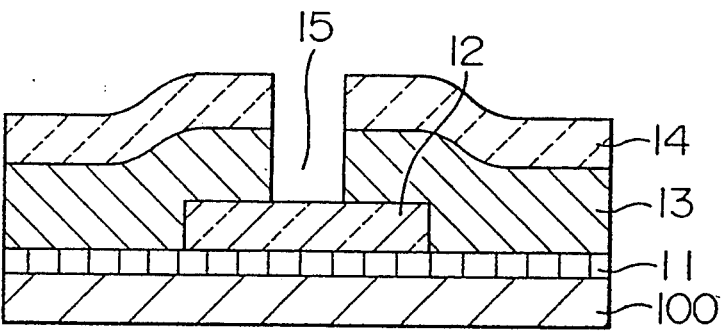

Next, by using a resin resist 14 formed by the photolithographic process as a mask, as shown in FIG. 1(b), the interlayer insulating film 13 is selectively removed by dry etching process, and a via hole 15 is formed.

Figure 1C:
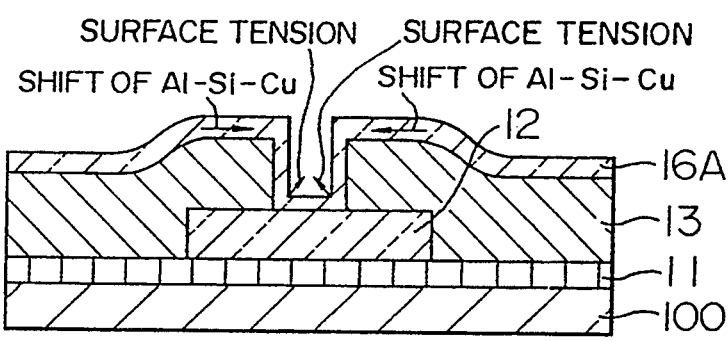

In FIG. 1(c), after removing the resin resist 14, a surface part of the first layer of metallic wiring 12 on the bottom of the via hole 15 is removed through the sputtering process sputtered by a depth of approximately 40 nm so that a natural oxide film on a first layer of metallic wiring 12 is removed. Thereafter, an Al-Si-Cu thin film 16A (composition: Al-1%Si-0.5%Cu) having a thickness of 0.2 μm is accumulated on the entire surface of the semiconductor device through the sputtering process at an accumulation temperature of 200° C. The thin film 16A may be arranged only on a side wall of the via hole 15. Furthermore, the natural oxide film on the first layer of metallic wiring 12 (if the thin film 16A is not formed on the first layer of metallic wiring 12) and the Al-Si-Cu thin film 16A are removed through the sputtering process and heat treatment is performed for 30 minutes in an atmosphere of argon (Ar) at a vacuum of approximately $10^{-7}$ Torr. Due to the heat treatment, on the bottom of the via hole 15, the first layer of metallic wiring 12 made of Al-Si-Cu is shifted into the via hole 15, causing a hillock. At this time, surface tension acts in the direction of an arrow, (see FIG. 2C) that is, in a direction in which the surface of the Al-Si-Cu thin film 16A is pushed upward. As a consequence, the bottom of the via hole 15 rises, and the Al-Si-Cu thin film 16A, which has become likely to diffuse at the surface thereof due to an increase in temperature in the vacuum atmosphere, is shifted into the via hole 15. The sputtering process is useful for removing only a surface part of the film or layer by a very small depth.

Figure 1D:
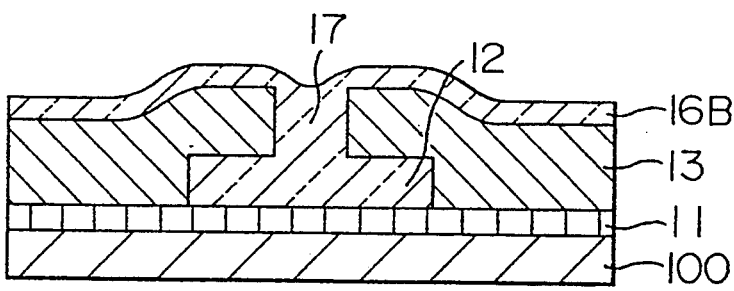

As a result, as shown in FIG. 1(d), the via hole 15 is completely filled with a portion 17 of Al-Si-Cu. The series of operations from the accumulation of the Al-Si-Cu thin film 16A to the heat treatment as shown in FIG. 1(c), were continuously performed at the inside a sputtering apparatus.

Figure 1E:
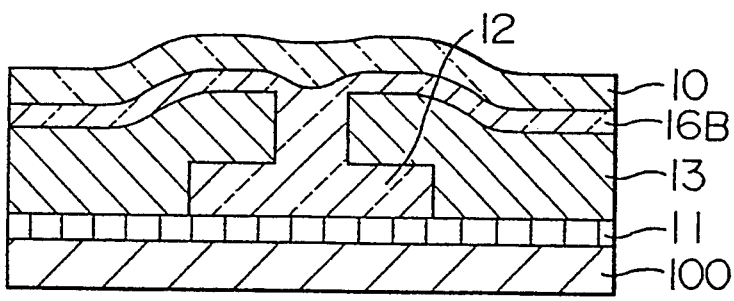

Finally, a second layer of metallic wiring film 10, made of, for example, Al-Si-Cu, is accumulated through the sputtering process by a thickness of 0.8 μm on an Al-Si-Cu thin film 16B, forming a wiring layer, as shown in FIG. 1(e).

Second Embodiment

Figure 2:
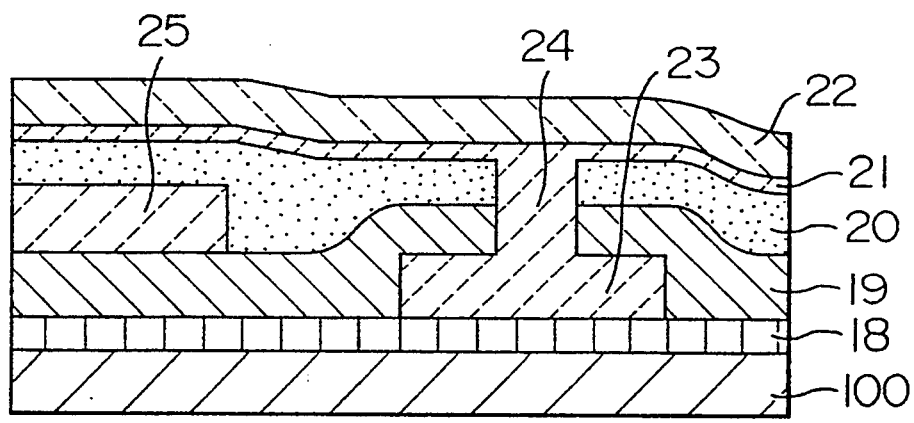
FIG. 2 is a cross-sectional view which illustrates a final step according to a second embodiment of the present invention.

FIG. 2 is a cross-sectional view which illustrates the final step in the method of manufacturing semiconductor devices according to the second embodiment of the present invention.

Since the method of connecting a first layer of metallic wiring 23 to a third layer of metallic wiring 22 in the manufacturing method according to this embodiment is the same as that of connecting the first layer metallic wiring 12 to the second layer of metallic wiring film 10 shown in FIG. 1, the explanation of the manufacturing step is omitted.

Although in the above-described first and second embodiments, connections between the first layer wiring and the second layer wiring, and between the first layer wiring and the third layer wiring were explained, the present invention is not limited to these connections. It can be applied to multilayer wiring of four or more layers.

Third Embodiment

Figure 3:
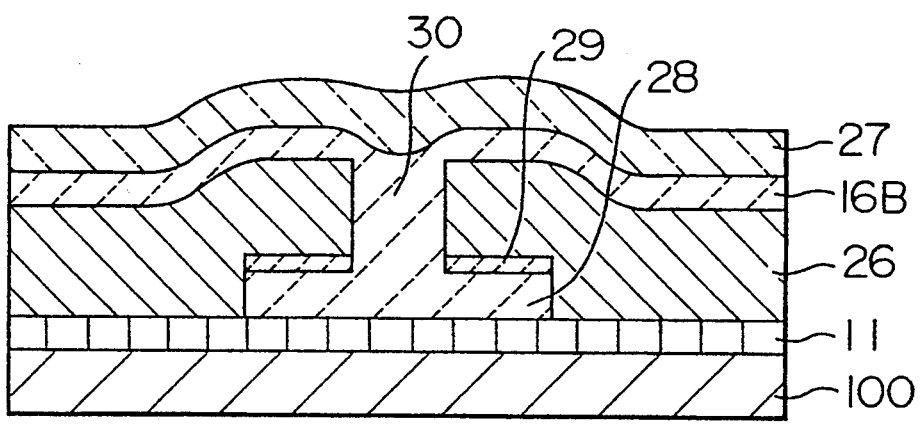
FIG. 3 is a cross-sectional view which illustrates a final step according to a third embodiment of the present invention.

FIG. 3 is a cross-sectional view which illustrates the final step in the method of manufacturing semiconductor devices according to the second embodiment of the present invention.

The difference between the manufacturing step of this embodiment and that of the first embodiment shown in FIG. 1 is that whereas a single-layer film made of Al-Si-Cu is used as the first layer of metallic wiring 12 in FIG. 1, a combination of an Al-Si-Cu film 28 and a titanium nitride film 29 (film thickness: 0.01 μm) is used as the first layer of metallic wiring in this embodiment. Therefore, when a via hole 30 is formed by dry etching, the titanium nitride film 29 at the inside a via hole 30 is over-etched to be removed therefrom so that the Al-Si-Cu film 28 is exposed. Regarding a method of filling the via hole 30, heat treatment for 30 minutes at 500° C. in an argon (Ar) at a vacuum of approximately $10^{-7}$ Torr is used, which is exactly the same as the step shown in FIG. 1(c). The use of an intermediate layer accelerates a slip of the electrically conductive layer on the electrically insulating layer.

The results of dependence on pressure during heat treatment of burying characteristics of a via hole manufactured according to this invention are shown in FIGS. 22A to 22C and 23A to 23C.

FIGS. 22A to 22C are schematic views of SEM photographs showing experimental results of the surface shapes of the via holes buried according to the present invention. FIGS. 23A to 23C are schematic views showing experimental results of yield in burying the via holes with the Al-Si-Cu film according to the present invention.

As is clear from FIGS. 22A to 22C, although when the pressure during heat treatment is $10 \times 10^{-3}$ Torr, the via hole is not filled in, when the pressure is $2 \times 10^{-3}$ Torr or more preferably $10^{-7}$ Torr, it is completely filled in.

FIGS. 22A to 22C show that an excellent burying yield were obtained the lower the pressure during heat treatment, in particular, in a high vacuum atmosphere of approximately $10^{-7}$ Torr.

Fourth Embodiment

FIGS. 4 to 10 are cross-sectional views which illustrate steps of a method of manufacturing semiconductor devices according to the fourth embodiment of the present invention.

Figure 4:
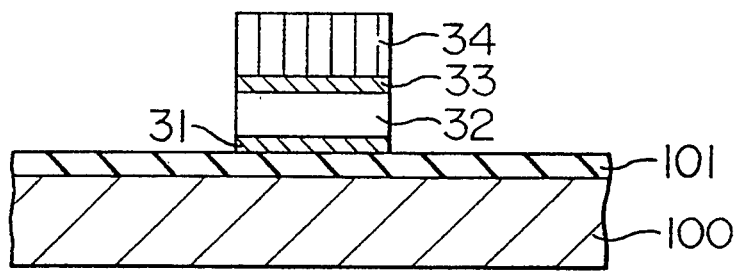
FIG. 4 is a cross-sectional view which illustrates a first step according to a fourth embodiment of the present invention.

In FIG. 4, for example, a titanium nitride film (film thickness: 0.01 nm), an alloy of aluminum/silicon/copper (film thickness: 0.7 μm, accumulation temperature: 50° C.), and a titanium nitride film (film thickness: 0.05 nm) are accumulated through the sputtering process on a basement insulating film 101 formed of, for example, the silicon oxide which is formed on a semiconductor substrate 100. A dry etching is performed by using a resist 4 as a mask by a lithographic technique, and a wiring layer formed composed of a first thin titanium nitride film 310, a first layer of metallic wiring 32 and a second thin titanium nitride film 33 is formed.

Figure 5:
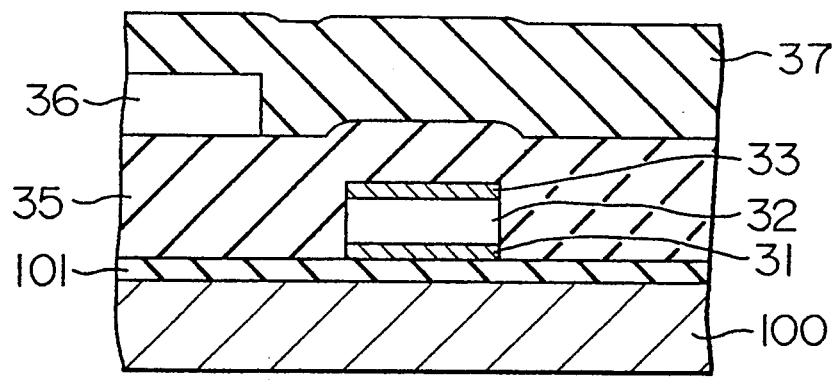
FIG. 5 is a cross-sectional view which illustrates a second step according to the above embodiment of the present invention.

In FIG. 5, after the resist 34 is removed, a first layer insulating film 35 formed of, for example, a silicon oxide film is accumulated on the entire surface of the semiconductor substrate. The surface of the first interlayer insulating film 35 is flattened by using the etchback method so that a thickness of the first interlayer insulating film 35 on the second thin film 33 is left as much as 0.8 μm. Thereafter, a second layer of metallic wiring 36 (film thickness: 0.8 μm) made of, for example, Al-Si-Cu, is formed, and then a second interlayer insulating film 37 formed of, for example, a silicon oxide film, is formed in the same manner as the first interlayer insulating film 35.

Figure 6:
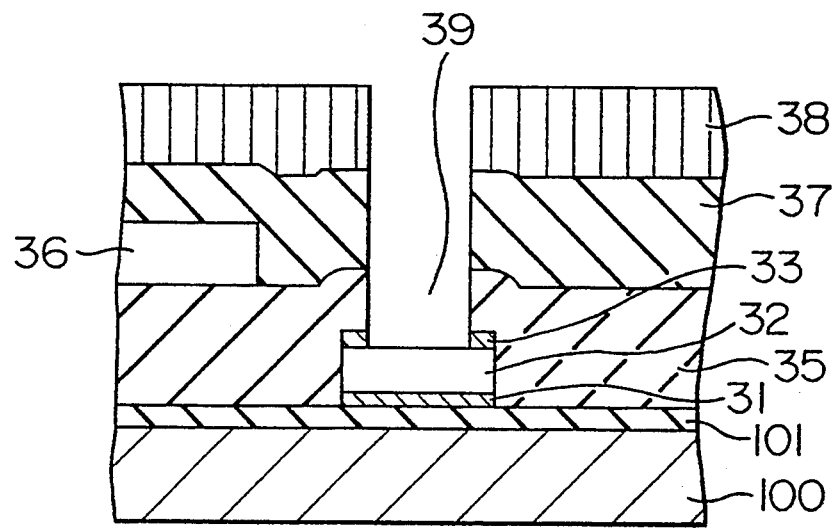
FIG. 6 is a cross-sectional view which illustrates a third step according to the above embodiment of the present invention.

In FIG. 6, a part of the second interlayer insulating film 37, a part of the first layer of insulating film 35 and a part of the second thin film 33 are in turn removed by using a resist 38 as a mask, so that a part of the first layer of metallic wiring 32 is exposed and a via hole 39 (opening diameter: 1.2 μm) is formed.

Figure 7:
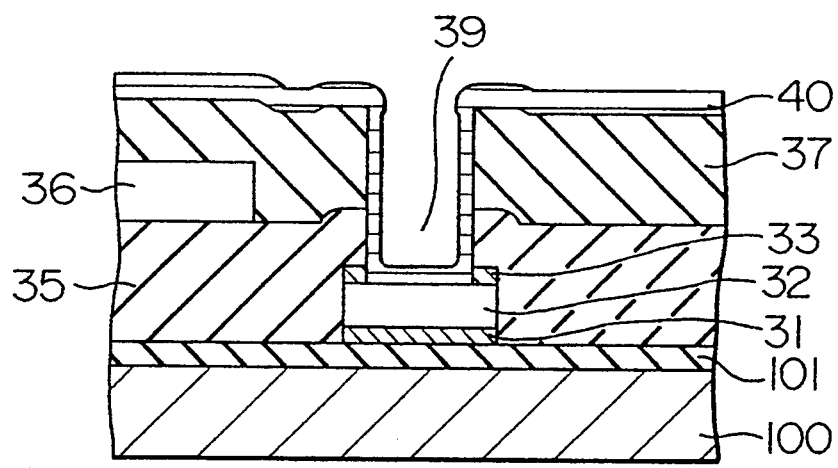
FIG. 7 is a cross-sectional view which illustrates fourth step according to the above embodiment of the present invention.

In FIG. 7, the resist 38 is removed, and a titanium nitride film 40 is accumulated by a thickness of 0.12 μm over the entire surface of the semiconductor substrate through the sputtering process. At this time, the titanium nitride film 40 of approximately 0.03 μm thickness, is formed on the side wall of the via hole 30.

Figure 8:
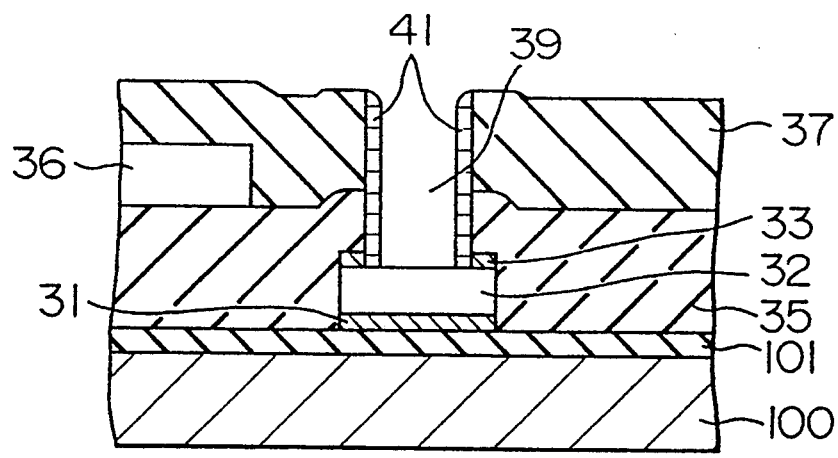
FIG. 8 is a cross-sectional view which illustrates a fifth step according to the above embodiment of the present invention.

At this point, when anisotropic etching is performed over the entire surface thereof and the titanium nitride film 40 is removed sufficiently to fully expose a surface of a part of the first layer of metallic wiring 32 at the inside of the via hole 30 and the top surface of the second interlayer insulating film 37, a side wall coating 41 (film thickness: a little less than 0.03 μm) of the titanium nitride is left on the side wall of the via hole 30 (FIG. 8).

Figure 9:
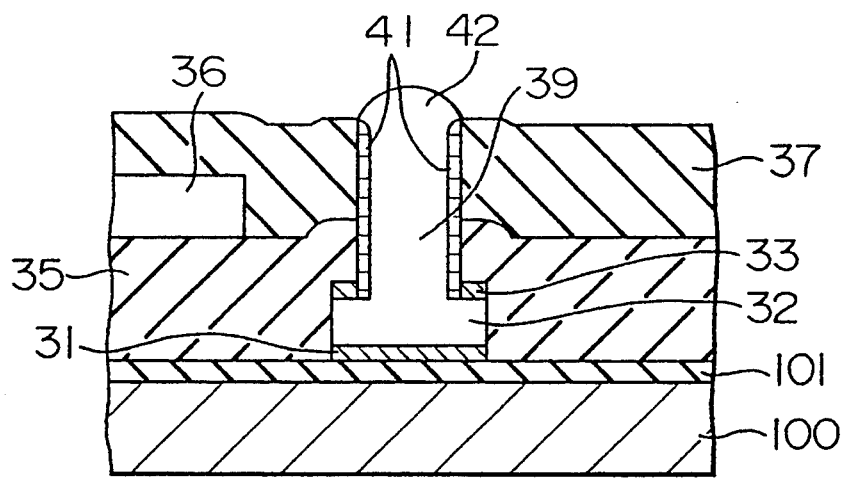
FIG. 9 is a cross-sectional view which illustrates a sixth step according to the above embodiment of the present invention.

In FIG. 9, next, when impurities on the surface of the first layer of metallic wiring 32 at the inside of the via hole 39 are removed through reverse sputtering process using, for example, argon (Ar) gas and thereafter the heat treatment is performed for 30 minutes at 500° C. in an argon (Ar) atmosphere at a vacuum of, for example, approximately $10^{-7}$ Torr, the first layer of metallic wiring 32 is viscously shifted in order to reduce compressive stress caused by the heat treatment; it protrudes in the via hole 39 which is an opening, forming a hillock 42 which reaches the top end of the via hole 39.

Figure 10:
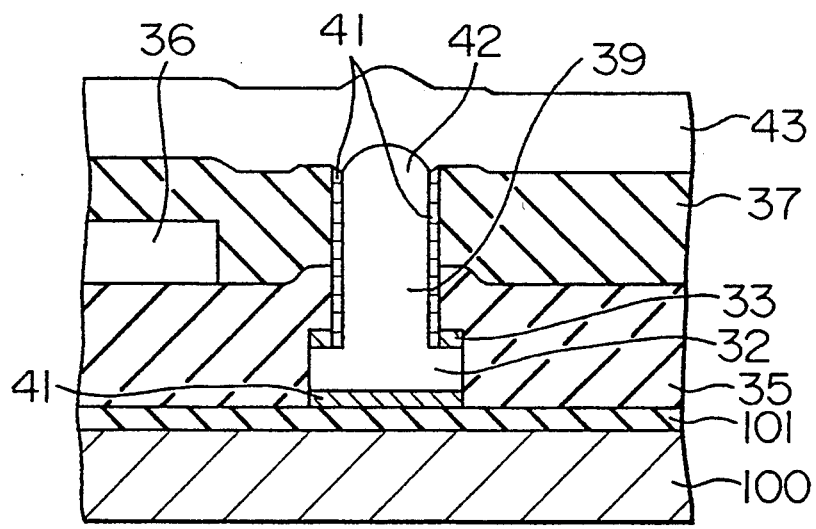
FIG. 10 is a cross-sectional view which illustrates a seventh step according to the above embodiment of the present invention.

Finally, after an impurity layer formed from an oxide or the like on the surface of the hillock 42 is removed by the reverse sputtering process using, for example, argon (Ar) gas, a third layer of metallic wiring 43 made of, for example, an Al-Si-Cu alloy, is formed, thus an excellent multilayer wiring interconnection portion is obtained, which is shown in FIG. 10.

According to this embodiment, as described above, the first layer of metallic wiring 32 slides on the side wall coating 41 inside the via hole 39 and is viscously shifted upward due to the heat treatment after the via hole 39 is opened, thereby forming the metallic wiring protrusion portion 42 which reaches the top end of the via hole 39. As a consequence, when the third layer of metallic wiring 43 is formed, a complete connection portion having no wiring thin film is formed. As a result, multilayer wiring interconnection having a high yield and reliability can be realized. In addition, in this embodiment, since the opening diameter of the via hole 39 is made smaller and the thicknesses of the first interlayer insulating film 35 and the second interlayer insulating film 37 can be secured sufficiently, miniaturization, higher integration, higher speed due to a reduction in the wiring capacity can also be realized at the same time. In addition, since the side wall coating 41 is formed only on the side wall of the via hole 39, the metallic wiring protrusion 42 is formed into a semi-circular shape due to the surface tension of the Al-Si-Cu alloy in the top end of the via hole 39 and difficult to flow out to the outside of the via hole 39 even if the heat treatment time takes longer, and the controllability of forming the metallic wiring protrusion 42 is high.

Fifth Embodiment

FIGS. 11 to 17 are cross-sectional views which illustrate steps of a method of manufacturing semiconductor devices, according to a fifth embodiment of the present invention.

Figure 11:
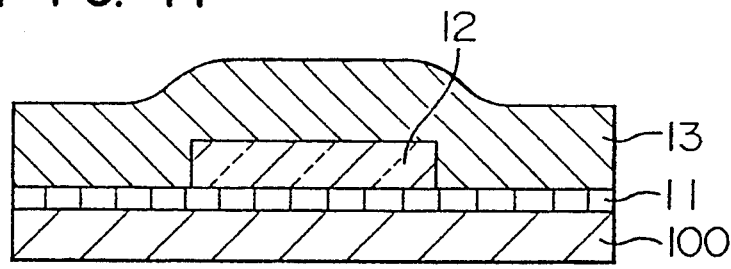
FIG. 11 is a cross-sectional view which illustrates a first step according to the fifth embodiment of the present invention.
Figure 12:
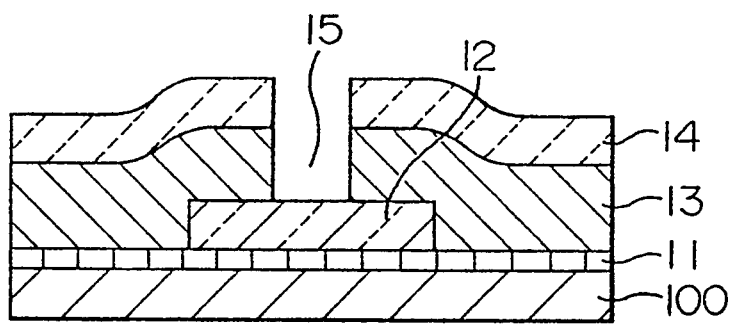
FIG. 12 is a cross-sectional view which illustrates a second step according to the above embodiment of the present invention.

The steps of FIGS. 11 and 12 are the same as those of FIG. 1(a) and 1(b), respectively.

Figure 13:
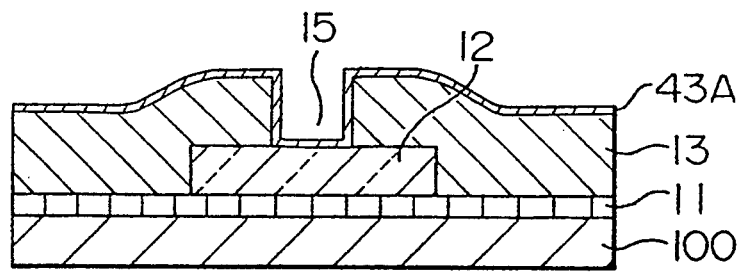
FIG. 13 is a cross-sectional view which illustrates a third step according to the above embodiment of the present invention.

In FIG. 13, the resist 14 is removed. A titanium nitride film 43A is accumulated through the sputtering process by a thickness of 0.12 μm on the entire surface of the semiconductor substrate. At the same time, a titanium nitride film 43A having a thickness of approximately 0.03 μm is formed on the side wall of the via hole 15.

Figure 14:
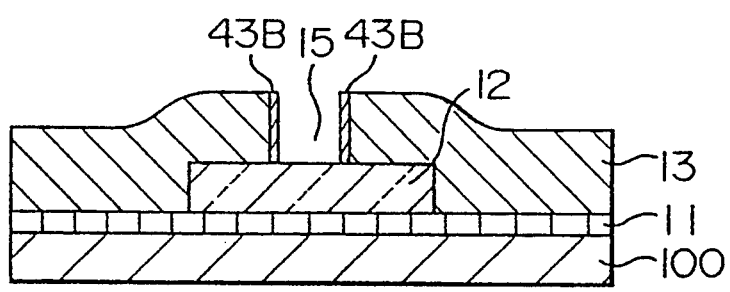
FIG. 14 is a cross-sectional view which illustrates a fourth step according to the above embodiment of the present invention.

In FIG. 14, the anisotropic etching is performed on the entire surface of the semiconductor device, so that the titanium nitride film 43A is removed sufficiently to fully expose the surface of the first layer of metallic wiring 12 at the inside of the via hole 15 and the top surface of the interlayer insulating film 13. A titanium nitride film 43B (film thickness: a little less than 0.03 μm) is left on the side wall of the via hole 15.

In FIG. 15, the Al-Si-Cu thin film 16A (composition: Al-1%Si-0.5%Cu) having a thickness of 0.2 μm is accumulated through the sputtering process at an accumulation temperature of 200° C. on the entire surface thereof. The thin film 16A may be arranged only on the side wall of the via hole 15. Furthermore, the natural oxide film on the Al-Si-Cu thin film 16A and the first layer of metallic wiring 12 (if the thin film 16a is not formed on the first layer of metallic wiring 12) is removed by the sputtering process again and subjected to heat treatment for 30 minutes at 500° C. in an atmosphere of argon (Ar) at a vacuum of approximately $10^{-7}$ Torr. At this time, since the surface tension acts in the direction of the arrow on the bottom of the via hole 15, that is, in such a manner as to push up, the surface of the Al-Si-Cu thin film 16A, and since Al-Si-Cu and the titanium nitride film have interfaces which are liable to cause sliding, the first layer of metallic wiring 12 made of Al-Si-Cu viscously shifts into the via hole 15. As a result, the bottom of the via hole 15 rises, and the Al-Si-Cu thin film 16A, which has become likely to diffuse on the surface due to an increase in the temperature of the vacuum atmosphere, is shifted into the via hole 15. At this time, the Al-Si-Cu thin film 16A becomes easy to shift because of the titanium nitride film 43B.

In FIG. 16, the via hole 15 is completely filled with a portion 17 of Al-Si-Cu.

Finally, the second layer of metallic wiring film 10, made of, for example, Al-Si-Cu, is accumulated by sputtering into a thickness of 0.8 μm on the Al-Si-Cu thin film 16B, forming a wiring layer, as shown in FIG. 17.

Sixth Embodiment

Figure 18:
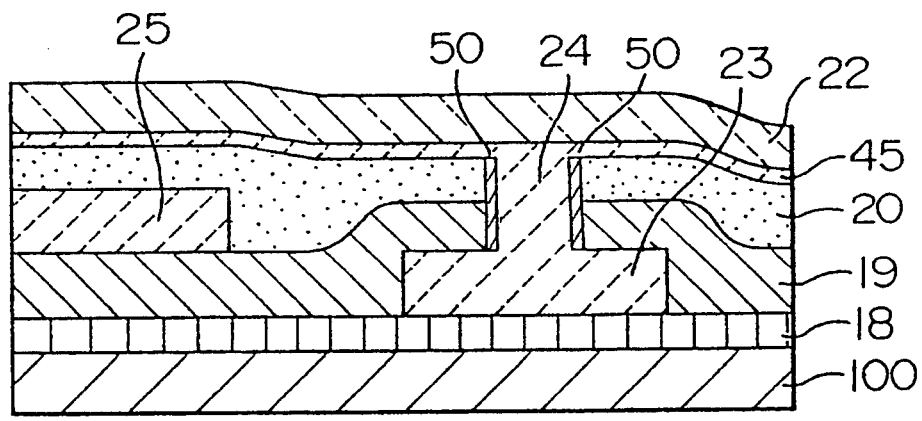
FIG. 18 is a cross-sectional view which illustrates a final step according to the sixth embodiment of the present invention.

FIG. 18 is a cross-sectional view which illustrates the final step in the method of manufacturing semiconductor devices, according to the sixth embodiment of the present invention.

Since the manufacturing method of connecting a first layer of metallic wiring 23 to a third layer of metallic wiring 22 according to this embodiment is the same as that of connecting the first layer of metallic wiring 12 to the second layer of metallic wiring film 10 shown in FIG. 17, an explanation of this manufacturing step is omitted.

Although in the above-described fifth and sixth embodiments, connections between the first layer of wiring and the second layer of wiring, and between the first layer wiring and the third layer wiring were explained, the present invention is not limited to these connections. It can be applied to multilayer wiring of four or more layers.

Seventh Embodiment

Figure 19:
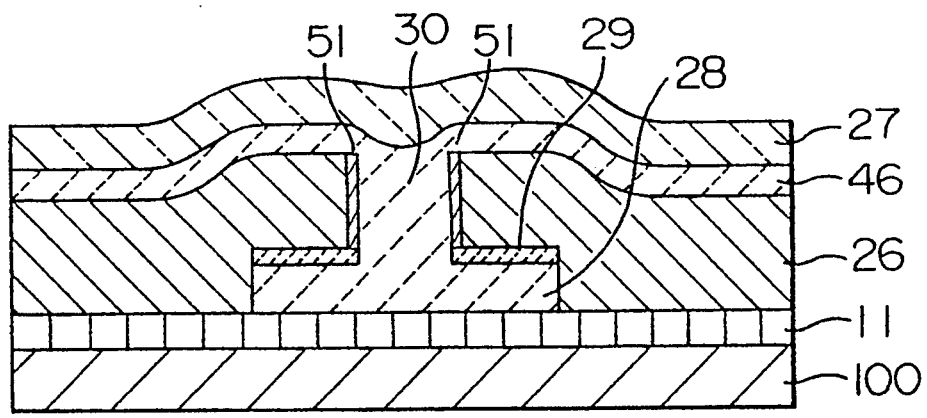
FIG. 19 is a cross-sectional view which illustrates a final step according to the seventh embodiment of the present invention.
Figure 20A:
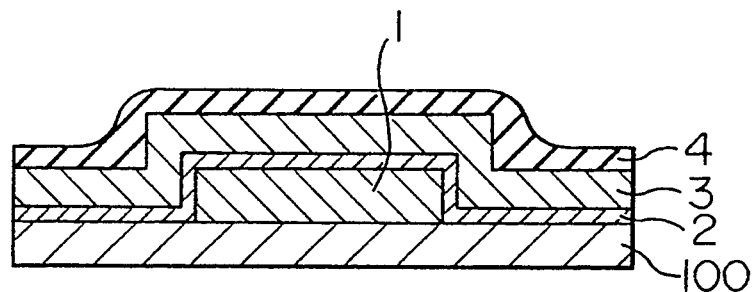
FIGS. 20(a)–(d) are cross-sectional view which illustrate a first embodiment of conventional steps of manufacturing a semiconductor device.
Figure 20B:
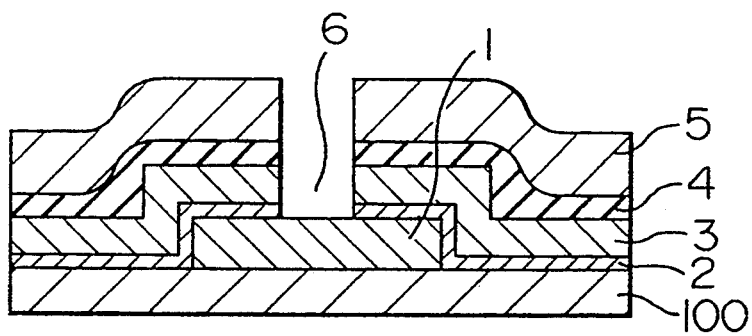
Figure 20C:
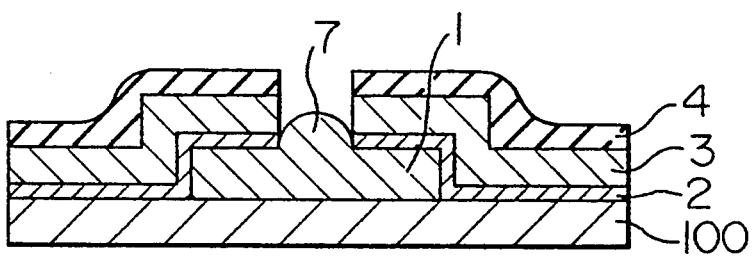
Figure 20D:
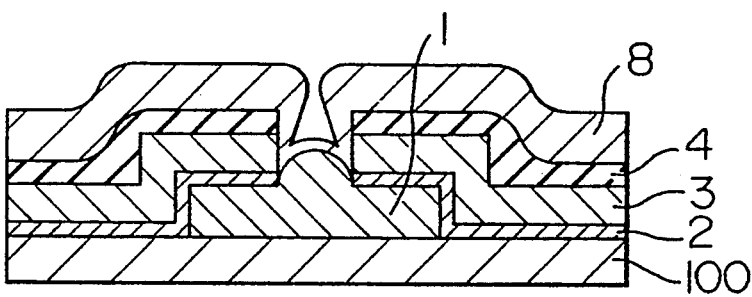
Figure 21A:
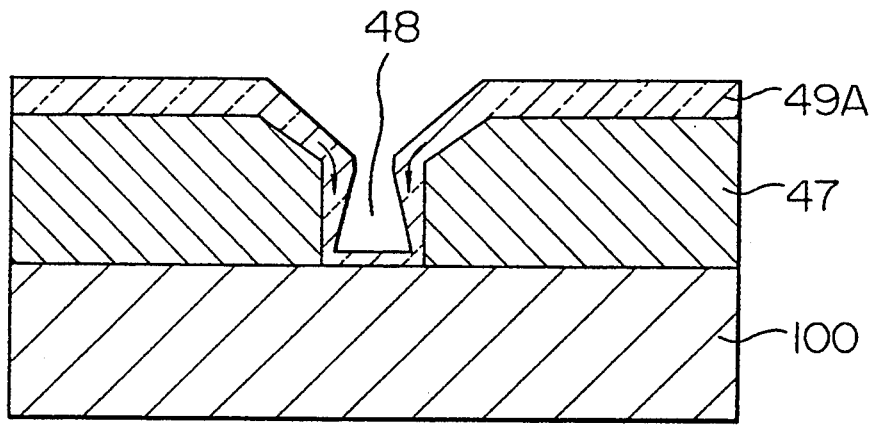
FIGS. 21(a) and (b) are cross-sectional views which illustrate a second embodiment of conventional steps of manufacturing a semiconductor device.
Figure 21B:
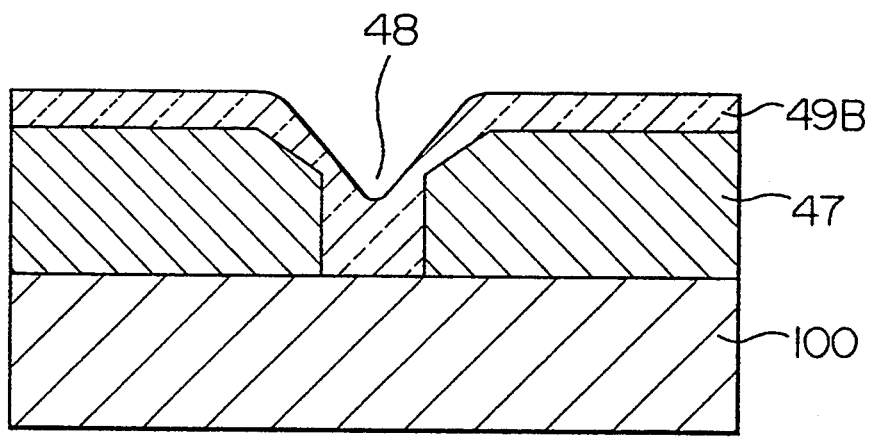

FIG. 19 is a cross-sectional view which illustrates the final step in the method of manufacturing semiconductor devices, according to the seventh embodiment of the present invention.

The difference between the manufacturing step of this embodiment and that of the fifth embodiment is that whereas a single-layer film made of Al-Si-Cu is used as the first layer of metallic wiring 12 in the fifth embodiment, the Al-Si-Cu film 28 and the titanium nitride film 29 (film thickness: 0.01 μm) were used as the first layer of metallic wiring in this embodiment. When the via hole 30 is formed by dry etching, the titanium nitride film 29 at the inside of the via hole 30 is over-etched and at the same time removed in order to expose the Al-Si-Cu film 28.

According to the present invention, as described above, there is provided a method of manufacturing semiconductor devices having a multilayer wiring structure which promotes the action of surface tension having the function of flatly burying hillocks in a via holes and by which, miniaturization, higher yield and reliability can be realized with a high degree of controllability.

Many different embodiments of the present invention may be constructed without departing from the spirit and scope of the present invention. It should be understood that the present invention is not limited to the specific embodiments described in this specification.

To the contrary, the present invention is intended to cover various modifications and equivalent arrangements included with the spirit and scope of the claims. The following claims are to be accorded a broad interpretation, so as to encompass all such modifications and equivalent structures and functions.

What is claimed is:

1. A method for extending an electrically conductive layer into a via hole which extends in an electrically insulating layer arranged on the electrically conductive layer, comprising the steps of:
    (a) forming an electrically conductive film on a side wall of the via hole, and
    (b) heating the electrically conductive film and the electrically conductive layer so that the electrically conductive film flows in the via hole and the electrically conductive layer projects in the via hole.

2. A method according to claim 1, wherein the electrically conductive film is heated after the electrically conductive film is formed.

3. A method according to claim 1, wherein the electrically conductive film is covered with a second electrically conductive layer after the electrically conductive film is heated.

4. A method according to claim 1, wherein the side wall extends straight from the electrically conductive layer within the electrically insulating layer.

5. A method according to claim 1, wherein the electrically conductive film is further formed on the electrically conductive layer in the via hole.

6. A method according to claim 1, wherein the electrically conductive film is further formed on the electrically insulating layer at the outside of the via hole.

7. A method according to claim 1, wherein a gas pressure around the electrically conductive film is decreased when the electrically conductive film is heated.

8. A method according to claim 7, wherein the gas pressure is not more than $2 \times 10^{-3}$ Torr.

9. A method according to claim 7, wherein the gas pressure is not more than $10^{-7}$ Torr.

10. A method according to claim 1, wherein an inert gas surrounds the electrically conductive film when the electrically conductive film is heated.

11. A method according to claim 1, wherein components of the electrically conductive layer are substantially identical to those of the electrically conductive film.

12. A method according to claim 1, wherein a main component of the electrically conductive layer is identical to that of the electrically conductive film.

13. A method according to claim 1, wherein a thickness of the electrically conductive film is reduced before the electrically conductive film is heated.

14. A method according to claim 1, wherein a thickness of the electrically conductive layer in the via hole is reduced before the electrically conductive film is heated.

15. A method according to claim 1, wherein the method further comprises an additional step of forming an intermediate film on the electrically conductive layer before the forming step so that a shift of the electrically conductive layer on the electrically insulating layer is accelerated.

16. A method according to claim 15, wherein the intermediate film accelerates a slip of the electrically conductive layer on the electrically insulating layer.

17. A method according to claim 15, wherein the intermediate film is arranged on a part of the electrically conductive layer, said part facing substantially the electrically insulating layer and not substantially the via hole.

18. A method according to claim 1, wherein the electrically conductive film includes aluminum.

19. A method according to claim 1, wherein the electrically conductive layer includes aluminum.

20. A method according to claim 1, wherein a gas pressure around the electrically conductive film is decreased in the forming step.

21. A method according to claim 1, wherein an inert gas surrounds the electrically conductive film in the forming step.

22. A method according to claim 1, wherein a temperature for heating the electrically conductive film is higher than a temperature for forming the electrically insulating layer.

23. A method according to claim 1, wherein a temperature for forming the electrically conductive film is not more than 100° C.

24. A method for extending an electrically conductive layer into a via hole which extends in an electrically insulating layer arranged on the electrically conductive layer, comprising the steps of:
    (a) forming an intermediate film on a side wall of the via hole, the intermediate film for accelerating a shift of said electrically conductive layer on the side wall, and
    (b) heating the electrically conductive layer so that the electrically conductive layer flows on the intermediate film and projects in the via hole.

25. A method according to claim 24, wherein the intermediate film is further arranged on the electrically insulating layer at the outside of the via hole.

26. A method according to claim 24, wherein the intermediate film includes titanium.

27. A method according to claim 26, wherein the intermediate film includes a titanium compound.

28. A method according to claim 24, wherein a gas pressure around the electrically conductive layer is decreased when the electrically conductive layer is heated.

29. A method according to claim 28, wherein the gas pressure is not more than $2 \times 10^{-3}$ Torr.

30. A method according to claim 28, wherein the gas pressure is not more than $10^{-7}$ Torr.

31. A method according to claim 24, wherein an inert gas surrounds the electrically conductive layer when the electrically conductive layer is heated.

32. A method according to claim 24, wherein the electrically conductive layer includes aluminum.

33. A method according to claim 24, wherein a temperature for heating the electrically conductive layer is higher than a temperature for forming the electrically insulating layer.

34. A method according to claim 24, wherein a thickness of the intermediate film is not more than 0.1 $\mu$m.

35. A method according to claim 24, wherein the electrically conductive layer includes single crystal aluminum.

36. A method according to claim 24, wherein a temperature for forming the electrically conductive layer is not more than 100° C.

37. A method according to claim 24, wherein the intermediate film is arranged on a part of the electrically conductive layer, said part facing the electrically insulating layer and not the via hole.

38. A method for extending an electrically conductive layer into a via hole which extends in an electrically insulating layer arranged on the electrically conductive layer, comprising the steps of:
(a) forming an intermediate film on a side wall of the via hole, the intermediate film for accelerating a shift of an electrically conductive substance arranged on the intermediate film, and
(b) heating the electrically conductive substance arranged on the intermediate film so that the electrically conductive substance flows on the intermediate film toward the electrically conductive layer and projects on the electrically conductive layer in the via hole,
whereby the electrically conductive layer is extended by said heating in step (b).

39. A method according to claim 38, wherein an electrically conductive film arranged on the intermediate film is heated as the electrically conductive substance in step (b).

40. A method according to claim 38, wherein the intermediate film accelerates a slip of the electrically conductive substance over the electrically insulating layer.

41. A method according to claim 38, wherein the intermediate film is not arranged on the electrically conductive layer in the via hole.

42. A method according to claim 35, wherein the intermediate film is further arranged on the electrically insulating layer at the outside of the via hole.

43. A method according to claim 39, wherein the electrically conductive film is also arranged on the electrically conductive layer in the via hole.

44. A method according to claim 38, wherein the intermediate film includes titanium.

45. A method according to claim 44, wherein the intermediate film includes titanium nitride.

46. A method according to claim 44, wherein the intermediate film includes a titanium compound.

47. A method according to claim 38, wherein a gas pressure around the electrically conductive substance is decreased when the electrically conductive substance is heated.

48. A method according to claim 47, wherein the gas pressure is not more than $2 \times 10^{-3}$ Torr.

49. A method according to claim 47, wherein the gas pressure is not more than $10^{-7}$ Torr.

50. A method according to claim 38, wherein an inert gas surrounds the electrically conductive substance when the electrically conductive substance is heated.

51. A method according to claim 39, wherein components of the electrically conductive layer are substantially identical to those of the electrically conductive film.

52. A method according to claim 39, wherein a main component of the electrically conductive layer is identical to that of the electrically conductive film.

53. A method according to claim 38, wherein a thickness of the intermediate film is reduced before the electrically conductive substance is formed.

54. A method according to claim 39, wherein a thickness of the electrically conductive film is reduced before the electrically conductive film is heated.

55. A method according to claim 38, wherein a thickness of the electrically conductive layer in the via hole is reduced before the electrically conductive substance is heated.

56. A method according to claim 38, wherein the electrically conductive substance includes aluminum.

57. A method according to claim 38, wherein the electrically conductive layer includes aluminum.

58. A method according to claim 39, wherein the electrically conductive film includes aluminum.

59. A method according to claim 39, wherein a gas pressure around the electrically conductive film is decreased when the electrically conductive film is formed on the intermediate film.

60. A method according to claim 39, wherein an inert gas surrounds the electrically conductive film when the electrically conductive film is formed on the intermediate film.

61. A method according to claim 38, wherein a temperature for heating the electrically conductive substance is higher than a temperature for forming the electrically insulating layer.

62. A method according to claim 39, wherein a temperature for forming the electrically conductive film is not more than 100° C.

63. A method according to claim 38, wherein a thickness of the intermediate film is not more than 0.1 $\mu$m.

64. A method according to claim 38, wherein the electrically conductive layer includes single crystal aluminum.

65. A method according to claim 41, wherein, in step (a), the intermediate film is formed on the electrically conductive layer in the via hole and subsequently a portion of the intermediate film on the electrically conductive layer in the via hole is removed while maintaining said intermediate film on said side wall.

66. A method according to claim 65, wherein the intermediate film on the electrically conductive layer in the via hole is removed through anisotropic etching process.

67. A method according to claim 38, wherein a temperature for forming the electrically conductive layer is not more than 100° C.

68. A method according to claim 38, wherein the intermediate film is arranged on a part of the electrically conductive layer, said part facing the electrically insulating layer and not the via hole.

69. A method according to claim 38, wherein the electrically conductive substance is covered with a electrically conductive layer after the electrically conductive substance is heated.

70. A method according to claim 38, wherein an electrically conductive film is arranged on the electrically insulating layer at the outside of the via hole before the electrically conductive substance is heated.

* * * * *